(12) United States Patent
Luo (10) Patent No.: US 7,777,547 B2
(45) Date of Patent: Aug. 17, 2010

(54) LEVEL SHIFTER FOR HIGH-SPEED AND LOW-LEAKAGE OPERATION

(75) Inventor: Yan-Bin Luo, Taipei (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 11/944,418

(22) Filed: Nov. 22, 2007

(65) Prior Publication Data

US 2009/0134929 A1    May 28, 2009

(51) Int. Cl.
  *H03L 5/00*    (2006.01)
(52) U.S. Cl. ............................. 327/333; 326/62; 326/63
(58) Field of Classification Search ................. 327/333; 326/62, 63
See application file for complete search history.

(56) References Cited

U.S. PATENT DOCUMENTS

| 6,614,283 B1 | 9/2003 | Wright |
| 6,642,769 B1 | 11/2003 | Chang |
| 6,963,226 B2 | 11/2005 | Chiang |
| 7,446,566 B1 * | 11/2008 | Chrudimsky ................. 326/68 |

* cited by examiner

*Primary Examiner*—Lincoln Donovan
*Assistant Examiner*—Daniel Rojas
(74) *Attorney, Agent, or Firm*—Winston Hsu (57) ABSTRACT

The present invention discloses a voltage level shifter capable of interfacing between two circuit systems having different operating voltage swings. The voltage level shifter comprises an input buffer having a low supply voltage for inverting an external input signal to an internal input signal, and an output buffer having a high supply voltage for inverting the internal input signal to an external output signal. The high level of the external input signal is lower than the high level of the external output signal. The voltage level shifter is designed such that the input buffer is operating to achieve a low-leakage and high-speed performance.

18 Claims, 8 Drawing Sheets

LEVEL SHIFTER FOR HIGH-SPEED AND LOW-LEAKAGE OPERATION

BACKGROUND OF THE INVENTION

1. Field of the Invention

The present invention relates to a voltage level shifter, and more particularly to a dual supply voltage input/out buffer capable of interfacing between two circuit systems having different voltage swings.

2. Description of the Prior Art

Historically, the primary mode of reducing power consumption in electronic circuits has been to insistently scale down the power supply voltage. Recently, a move to 1.8 V power supply has been popularized among low-power and high-speed circuit designers. Problems may arise where both low and high voltage integrated circuits are connected together. An integrated circuit operating on a lower voltage must then provide an output at the higher voltage.

A typical solution to this problem is to add an intermediate voltage level shifter between an internal circuitry having a low voltage swing and an external circuitry having a high voltage swing. A special concern has been focused on a 3.3 V driver for 1.8 V process.

Figure 1:
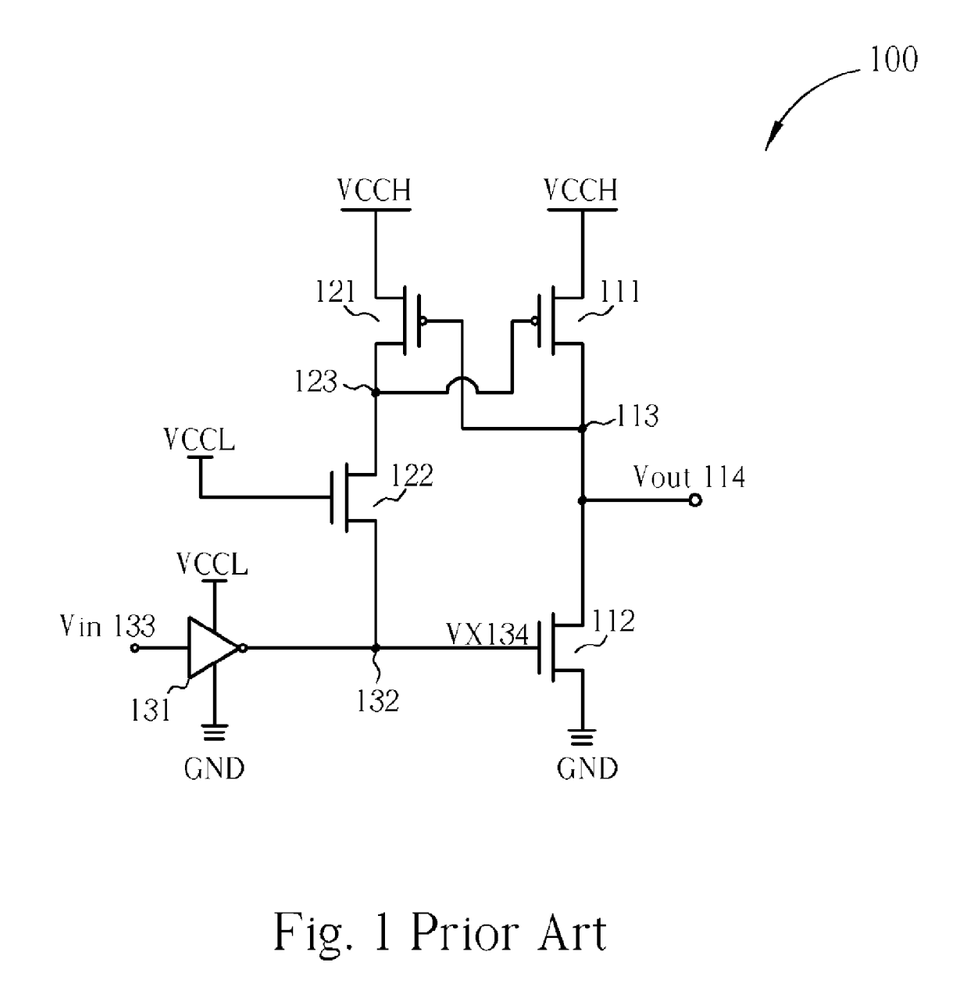
FIG. 1 is a circuit diagram schematically illustrating a voltage level shifter according to the prior art.

Please refer to FIG. 1. FIG. 1 is a circuit diagram schematically illustrating a voltage level shifter 100 according to the prior art. The voltage level shifter 100 of the prior art comprises a first transistor 111, a second transistor 112, a third transistor 121, a fourth transistor 122, and an inverter 131. In addition, there is a reference voltage generator, not shown in the figure, for providing a high supply voltage VCCH and a low supply voltage VCCL.

The voltage supply of the inverter 131 is the low supply voltage VCCL. The external output signal VOUT 114 is taken out from the first contact point 113.

The inverter 131 functions to invert the external input signal VIN 133 to generate an internal input signal VX 134 at the third contact point 132. That is, the internal input signal VX 134 is at a low voltage while the external input signal VIN 133 is at a ground voltage and the internal input signal VX 134 is at a ground voltage while the external input signal VIN 133 is at a low voltage.

The second transistor 112 in conjunction with the first transistor 111 acts to perform an inverting process having different voltage swings between inputting and outputting. That is, the external output signal VOUT 114 is at a high voltage while the internal input signal VX 134 is at a ground voltage and the external output signal VOUT 114 is at a ground voltage while the internal input signal VX 134 is at a low voltage.

When a ground voltage is applied to the external input signal VIN 133, the internal input signal VX 134 at the third contact point 132 is switching to a low voltage by the inverter 131. The second transistor 112 is turned on due to the low voltage furnished to its gate terminal connected to the third contact point 132.

Consequently, the external output signal VOUT 114 connected to the drain of the second transistor 112 is grounded through the second transistor 112 and is pulled down to the ground voltage. The external output signal VOUT 114 having a ground voltage is then coupled into the gate of the third transistor 121 and turns on the third transistor 121. The voltage at the second contact point 123 is now pulled up to the high voltage provided by the high supply voltage VCCH through the third transistor 121. The high voltage at the second contact point 123 is then coupled into the gate of the first transistor 111 and turns off the first transistor 111. That is, the external output signal VOUT 114 cannot be pulled up to the high voltage through the first transistor 111.

The gate-source voltage drop of the fourth transistor 122 is about zero voltage because both its gate voltage and its source voltage at the third contact point 132 are held at the same low voltage, which will turn off the fourth transistor 122. The circuit operation process described above forms a self-consistent action.

When a low voltage is applied to the external input signal VIN 133, the internal input signal VX 134 at the third contact point 132 is switching to a ground voltage by the inverter 131. The second transistor 112 is turned off due to the ground voltage furnished to its gate terminal connected to the third contact point 132.

Consequently, the external output signal VOUT 114 connected to the drain of the second transistor 112 cannot be pulled down to the ground voltage. However, the gate-source voltage drop of the fourth transistor 122 is then approximately equal to the low voltage because of the low voltage at its gate terminal and the ground voltage at its source terminal, which means at the third contact point 132, and the fourth transistor 122 is then turned on. The ground voltage at the third contact point 132 is thus coupled to the gate of the first transistor 111 through the fourth transistor 122 and turns on the first transistor 111.

Thereby, the first contact point 113 is electrically connected to the high supply voltage VCCH through the first transistor 111 and the external output signal VOUT 114 can be pulled up to the high voltage. The high voltage at the first contact point 113 is then coupled to the gate of the third transistor 121 and turns off the third transistor 121. Again, the circuit operation process described above forms a self-consistent action.

In the prior art voltage level shifter 100, the fourth transistor 122 of is a thick oxide device, which means that the threshold voltage of the fourth transistor 122 is relatively higher compared with that of a thin oxide device. That is, when the internal input signal VX 134 at the third contact point 132 changes from a ground voltage to a low voltage, the second transistor 112 switches from an off-state to an on-state.

Meanwhile, the fourth transistor 122 switches from an on-state to an off-state. The state switching processes for the second transistor 112 and the fourth transistor 122 must co-act to form a self-consistent operation.

However, a higher threshold voltage of the fourth transistor 122 in conjunction with a fixed low supply voltage VCCL at its gate terminal means that the voltage swing of the internal input signal VX 134 at the third contact point 132 for the fourth transistor 122 to switch on-off state is also larger, which further means a longer time must be taken for state-switching processes. Therefore, a move to a high-speed operation of the internal circuitry may excess the state-switching speed of the related transistors in the voltage level shifter 100, which may cause a malfunction of the voltage level shifter 100.

Figure 2:
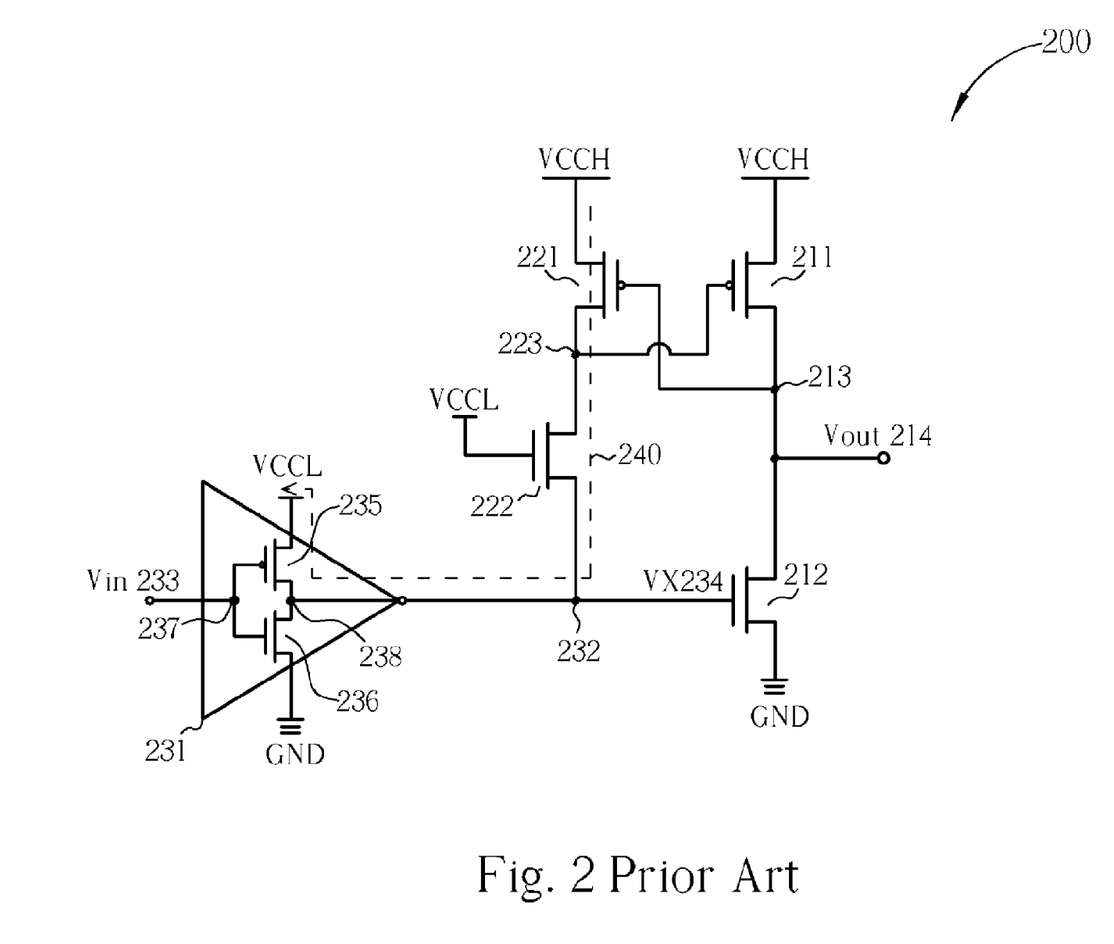
FIG. 2 is a circuit diagram schematically illustrating another voltage level shifter according to the prior art.

Please refer to FIG. 2. FIG. 2 is a circuit diagram schematically illustrating another voltage level shifter 200 according to the prior art. The voltage level shifter 200 of the prior art comprises a first transistor 211, a second transistor 212, a third transistor 221, a fourth transistor 222 having a low threshold voltage, and an inverter 231. In addition, there is a reference voltage generator, not shown in the figure, for providing a high supply voltage VCCH and a low supply voltage VCCL.

The inverter 231 comprises a fifth transistor 235 and a sixth transistor 236. The fourth transistor 222 is designed to be a transistor of low threshold voltage or even zero threshold voltage.

The essential operations of the voltage level shifter 200 and the voltage level shifter 100 are the same. However, due to the low threshold voltage of the fourth transistor 222, the voltage swing of the internal input signal VX 234 at the third contact point for the fourth transistor 222 to switch on-off state is smaller, which means the time duration taken for state-switching processes is shorter. Therefore, the voltage level shifter 200 can accommodate itself to a high-speed internal circuitry.

Nevertheless, a leakage pathway may occur to the voltage level shifter 200 in certain situation described below. That is, when a ground voltage is applied to the external input signal VIN 233, the fifth transistor 235 is turned on and the sixth transistor 236 is turned off. The internal input signal VX 234 at the third contact point 232 is then pulled up to a low voltage through the fifth transistor 235 in the inverter 231. The second transistor 212 is turned on due to the low voltage furnished to its gate terminal connected to the third contact point 232.

Ideally, the gate-source voltage drop of the fourth transistor 222 is about zero voltage because both its gate voltage and its source voltage at the third contact point 232 are held at about the same low voltage, which will turn off the fourth transistor 222. However, the voltage of the gate of the fourth transistor 222 is exactly equal to the lower supply voltage VCCL and the voltage at the third contact point 232, which is also the source terminal of the fourth transistor 222, is actually less than the lower supply voltage VCCL due to the inner voltage drop of the inverter 231, which is well known to those skilled in the art.

If the voltage difference between the gate voltage and the source voltage of the fourth transistor 222 excesses the low threshold voltage of the fourth transistor 222, the state of the fourth transistor 222 can not be completely turned off while it should be. Under such circumstance, the on-state third transistor 221 in conjunction with the on-state fourth transistor 222 will result in a power leakage pathway 240 that is shown in FIG. 2 as a dashed line extending from the high supply voltage VCCH to the low supply voltage VCCL through the on-state fifth transistor 235 of the inverter 231. The power leakage pathway 240 will sacrifice the benefit of having lower operating voltage.

Consequently, there is a great need for providing a voltage level shifter capable of high-speed and low-leakage operation.

SUMMARY OF THE INVENTION

The present invention provides a voltage level shifter capable of interfacing between two circuit systems having different operating voltage swings. The voltage level shifter comprises a first transistor, a second transistor, a third transistor, a fourth transistor having a low threshold voltage, and an inverter. In addition, there is a reference voltage generator for providing a high supply voltage and a low supply voltage.

The drain of the first transistor and the drain of the second transistor are electrically connected at a first contact point. The drain of the third transistor and the drain of the fourth transistor are electrically connected at a second contact point.

The source of the first transistor and the source of the third transistor are both electrically connected to a high supply voltage. The source of the second transistor is electrically connected to a ground GND. The gate of the third transistor is electrically connected to the drain of the first transistor at the first contact point. The gate of the first transistor is electrically connected to the drain of the third transistor at the second contact point. The gate of the fourth transistor is electrically connected to the external input signal. The input of the inverter is also electrically connected to the external input signal and the output of the inverter is electrically connected to both the source of the fourth transistor and the gate of the second transistor at a third contact point. The voltage supply of the inverter is the low supply voltage. The external output signal is taken out from the first contact point.

The inverter functions to invert the external input signal to generate an internal input signal at a third contact point. The second transistor in conjunction with the first transistor acts to perform an inverting process having different voltage swings between inputting and outputting.

When a ground voltage is applied to the external input signal, the ground voltage is then furnished to both the input of the inverter and the gate of the fourth transistor. The internal input signal at the third contact point is switching to a low voltage by the inverter. The second transistor is turned on due to the low voltage furnished to its gate terminal connected to the third contact point.

Consequently, the external output signal connected to the drain of the second transistor is grounded through the second transistor and is pulled down to the ground voltage. The external output signal having a ground voltage is then coupled into the gate of the third transistor and turns on the third transistor. The voltage at the second contact point is now pulled up to the high voltage by the high supply voltage through the third transistor. The high voltage at the second contact point is then coupled into the gate of the first transistor and turns off the first transistor. That is, the external output signal cannot be pulled up to the high voltage through the first transistor. The gate voltage of the fourth transistor having a ground voltage minus the source voltage of the fourth transistor having a low voltage leaves the gate-source voltage drop of the fourth transistor, which is now a minus voltage and will definitely turn off the fourth transistor having a low threshold voltage.

Therefore, the power leakage pathway in the high-speed level shifter of the prior art is not likely to occur in the level shifter of the claimed invention. Accordingly, the circuit operation process described above forms a robust self-consistent action capable of achieving a high-speed performance without any power leakage problem.

When a low voltage is applied to the external input signal, the low voltage is then furnished to both the input of the inverter and the gate of the fourth transistor. The internal input signal at the third contact point is switching to a ground voltage by the inverter. The second transistor is turned off due to the ground voltage furnished to its gate terminal connected to the third contact point.

Consequently, the external output signal connected to the drain of the second transistor cannot be pulled down to the ground voltage. However, the gate-source voltage drop of the fourth transistor is now approximately equal to the low voltage because of the low voltage at its gate terminal and the ground voltage at its source terminal, which means at the third contact point, and the fourth transistor is then turned on. The ground voltage at the third contact point is thus coupled to the gate of the first transistor through the fourth transistor and turns on the first transistor.

Accordingly, the first contact point is electrically connected to the high supply voltage through the first transistor and the external output signal can be pulled up to the high voltage. The high voltage at the first contact point is then coupled to the gate of the third transistor and turns off the third transistor. Again, the circuit operation process described above forms a robust self-consistent action.

In summary, the voltage level shifter of the claimed invention provides a robust circuit design to advance the circuit performance for high-speed and low-leakage operation.

These and other objectives of the present invention will no doubt become obvious to those of ordinary skill in the art after reading the following detailed description of the preferred embodiment that is illustrated in the various figures and drawings.

DETAILED DESCRIPTION

The foregoing aspects and many of the attendant advantages of this invention will become more readily appreciated as the same becomes better understood by reference to the following detailed description, when taken in conjunction with the accompanying drawings.

Figure 3:
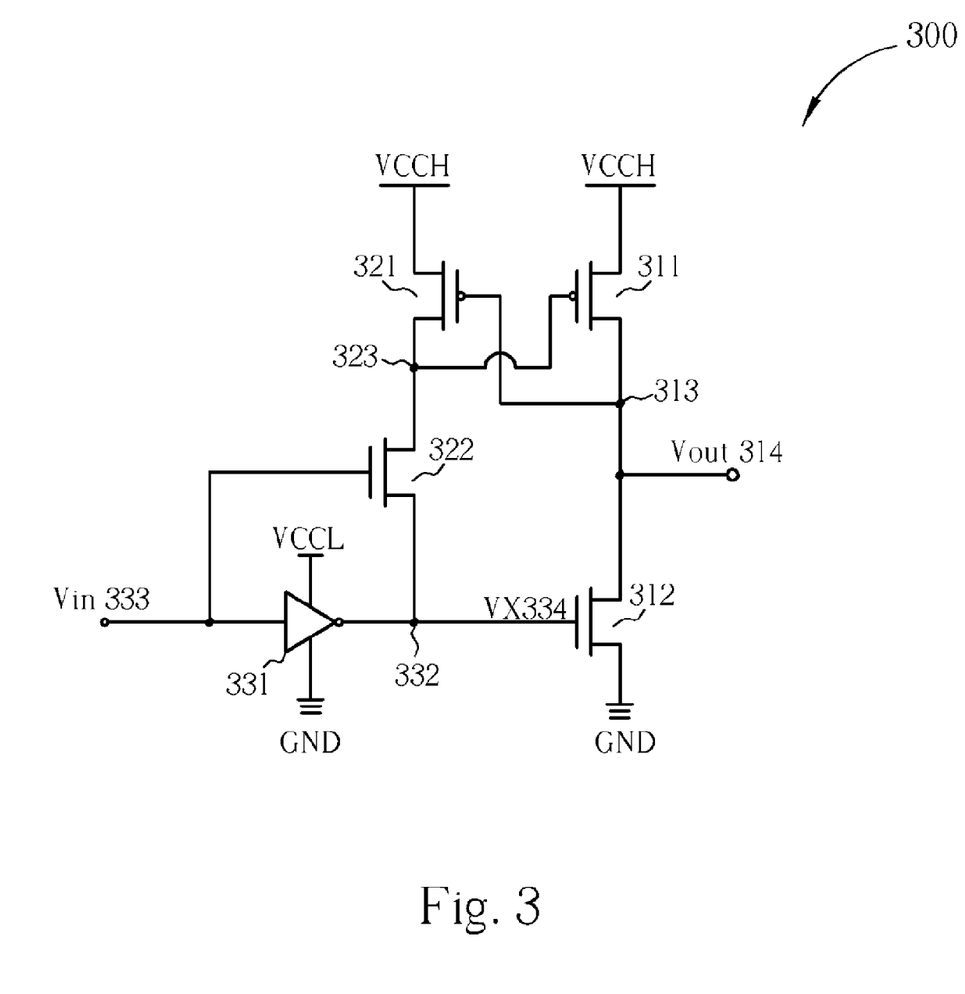
FIG. 3 is a circuit diagram schematically illustrating a first preferred embodiment of the voltage level shifter according to the claimed invention

Please refer to FIG. 3. FIG. 3 is a circuit diagram schematically illustrating a first preferred embodiment of a voltage level shifter 300 according to the present invention. The voltage level shifter 300 of the claimed invention comprises a first transistor 311, a second transistor 312, a third transistor 321, a fourth transistor 322 having a low threshold voltage, and an inverter 331. In addition, there is a reference voltage generator, not shown in the figure, for providing a high supply voltage VCCH and a low supply voltage VCCL.

The drain of the first transistor 311 and the drain of the second transistor 312 are electrically connected at a first contact point 313. The drain of the third transistor 321 and the drain of the fourth transistor 322 are electrically connected at a second contact point 323.

The source of the first transistor 311 and the source of the third transistor 321 are both electrically connected to a high supply voltage VCCH. The source of the second transistor 312 is electrically connected to a ground GND. The gate of the third transistor 321 is electrically connected to the drain of the first transistor 311 at the first contact point 313. The gate of the first transistor 311 is electrically connected to the drain of the third transistor 321 at the second contact point 323. The gate of the fourth transistor 322 is electrically connected to the external input signal VIN 333. The input of the inverter 331 is also electrically connected to the external input signal VIN 333 and the output of the inverter 331 is electrically connected to both the source of the fourth transistor 322 and the gate of the second transistor 312 at a third contact point 332. The voltage supply of the inverter 331 is the low supply voltage VCCL. The external output signal VOUT 314 is taken out from the first contact point 313.

The inverter 331 functions to invert the external input signal VIN 333 to generate an internal input signal VX 334 at the third contact point 332. That is, the internal input signal VX 334 is at a low voltage while the external input signal VIN 333 is at a ground voltage and the internal input signal VX 334 is at a ground voltage while the external input signal VIN 333 is at a low voltage.

The second transistor 312 in conjunction with the first transistor 311 acts to perform an inverting process having different voltage swings between inputting and outputting. That is, the external output signal VOUT 314 is at a high voltage while the internal input signal VX 334 is at a ground voltage and the external output signal VOUT 314 is at a ground voltage while the internal input signal VX 334 is at a low voltage.

When a ground voltage is applied to the external input signal VIN 333, the ground voltage is then furnished to both the input of the inverter 331 and the gate of the fourth transistor 322. The internal input signal VX 334 at the third contact point 332 is switching to a low voltage by the inverter 331. The second transistor 312 is turned on due to the low voltage furnished to its gate terminal connected to the third contact point 332.

Consequently, the external output signal VOUT 314 connected to the drain of the second transistor 312 is grounded through the second transistor 312 and is pulled down to the ground voltage. The external output signal VOUT 314 having a ground voltage is then coupled into the gate of the third transistor 321 and turns on the third transistor 321. The voltage at the second contact point 323 is now pulled up to the high voltage by the high supply voltage VCCH through the third transistor 321. The high voltage at the second contact point 323 is then coupled into the gate of the first transistor 311 and turns off the first transistor 311. That is, the external output signal VOUT 314 cannot be pulled up to the high voltage through the first transistor 311. The gate voltage of the fourth transistor 322 having a ground voltage minus the source voltage of the fourth transistor 322 having a low voltage leaves the gate-source voltage drop of the fourth transistor 322, which is now a minus voltage and will definitely turn off the fourth transistor 322 having a low threshold voltage.

Accordingly, the power leakage pathway in the high-speed level shifter 200 of the prior art is not likely to occur in the level shifter 300 of the claimed invention. Accordingly, the circuit operation process described above forms a robust self-consistent action capable of achieving a high-speed performance without any power leakage problem.

When a low voltage is applied to the external input signal VIN 333, the low voltage is then furnished to both the input of the inverter 331 and the gate of the fourth transistor 322. The internal input signal VX 334 at the third contact point 332 is switching to a ground voltage by the inverter 331. The second transistor 312 is turned off due to the ground voltage furnished to its gate terminal connected to the third contact point 332.

Consequently, the external output signal VOUT 314 connected to the drain of the second transistor 312 cannot be pulled down to the ground voltage. However, the gate-source voltage drop of the fourth transistor 322 is now approximately equal to the low voltage because of the low voltage at its gate terminal and the ground voltage at its source terminal, which means at the third contact point, and the fourth transistor 322 is then turned on. The ground voltage at the third contact point 332 is thus coupled to the gate of the first transistor 311 through the fourth transistor 322 and turns on the first transistor 311.

Accordingly, the first contact point 313 is electrically connected to the high supply voltage VCCH through the first transistor 311 and the external output signal VOUT 314 can be pulled up to the high voltage. The high voltage at the first contact point 313 is then coupled to the gate of the third transistor 321 and turns off the third transistor 321. Again, the circuit operation process described above forms a robust self-consistent action.

In summary, the voltage level shifter 300 is a robust circuit design having a high-speed and low-leakage performance.

Figure 4:
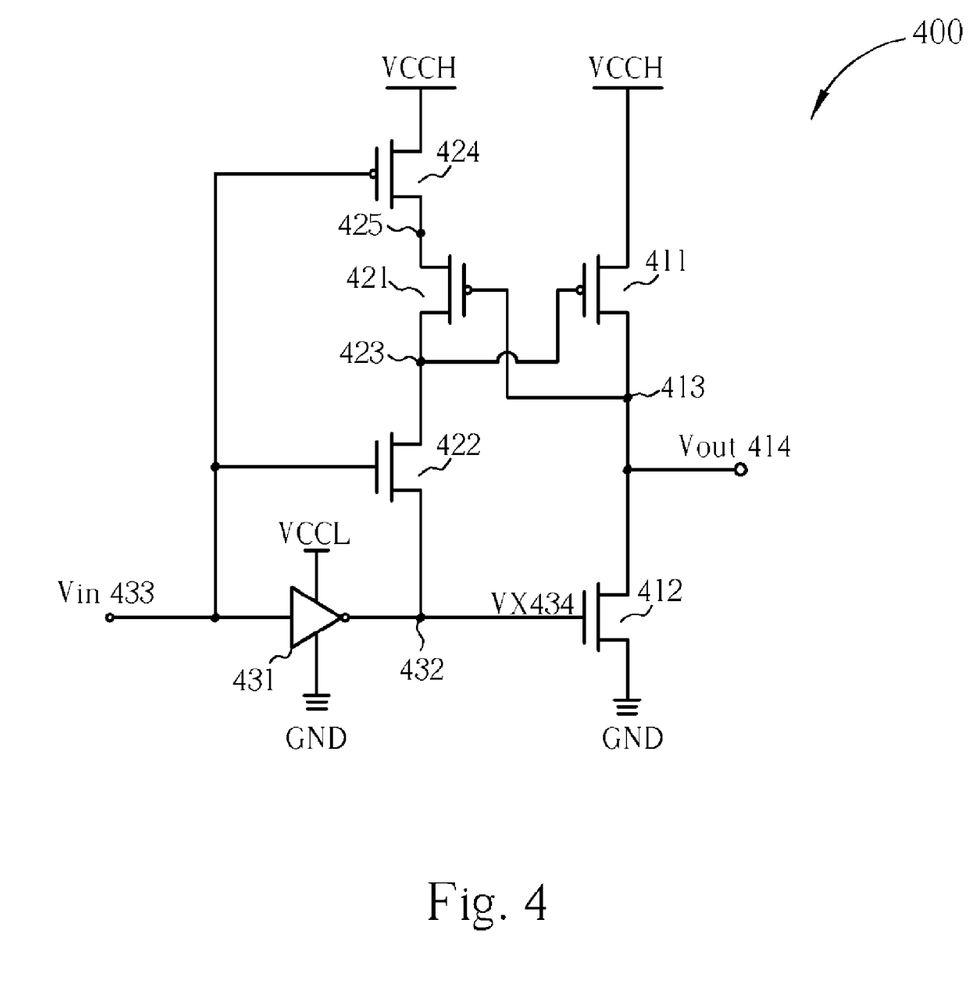
FIG. 4 is a circuit diagram schematically illustrating a second preferred embodiment of the voltage level shifter according to the claimed invention.

Please refer to FIG. 4. FIG. 4 is a circuit diagram schematically illustrating a second preferred embodiment of a voltage level shifter 400 according to the present invention. The voltage level shifter 400 of the claimed invention comprises a first transistor 411, a second transistor 412, a third transistor 421, a fourth transistor 422 having a low threshold voltage, a fifth transistor 424, and an inverter 431. In addition, there is a reference voltage generator, not shown in the figure, for providing a high supply voltage VCCH and a low supply voltage VCCL.

The structure of the voltage level shifter 400 is the same as that shown in FIG. 3, differing only in that the fifth transistor 424 is added and coupled between the third transistor 421 and the high supply voltage VCCH.

The inverter 431 functions to invert the external input signal VIN 433 to generate an internal input signal VX 434 at the third contact point 432. That is, the internal input signal VX 434 is at a low voltage while the external input signal VIN 433 is at a ground voltage and the internal input signal VX 434 is at a ground voltage while the external input signal VIN 433 is at a low voltage.

The second transistor 412 in conjunction with the first transistor 411 acts to perform an inverting process having different voltage swings between inputting and outputting. That is, the external output signal VOUT 414 is at a high voltage while the internal input signal VX 434 is at a ground voltage and the external output signal VOUT 414 is at a ground voltage while the internal input signal VX 434 is at a low voltage.

When a ground voltage is applied to the external input signal VIN 433, the ground voltage is then furnished to the input of the inverter 431, the gate of the fifth transistor 424, and the gate of the fourth transistor 422. The fifth transistor 424 is then turned on due to the ground voltage applied to its gate terminal. The internal input signal VX 434 at the third contact point 432 is switching to a low voltage by the inverter 431. The second transistor 412 is turned on due to the low voltage furnished to its gate terminal connected to the third contact point 432.

Consequently, the external output signal VOUT 414 connected to the drain of the second transistor 412 is grounded through the second transistor 412 and is pulled down to the ground voltage. The external output signal VOUT 414 having a ground voltage is then coupled into the gate of the third transistor 421 and turns on the third transistor 421. The voltage at the second contact point 423 is now pulled up to the high voltage by the high supply voltage VCCH through the third transistor 421 and the fifth transistor 424. The high voltage at the second contact point 423 is then coupled into the gate of the first transistor 411 and turns off the first transistor 411. That is, the external output signal VOUT 414 cannot be pulled up to the high voltage through the first transistor 411. The gate voltage of the fourth transistor 422 having a ground voltage minus the source voltage of the fourth transistor 422 having a low voltage leaves the gate-source voltage drop of the fourth transistor 422, which is now a minus voltage and will definitely turn off the fourth transistor 422 having a low threshold voltage.

Accordingly, the power leakage pathway in the high-speed level shifter 200 of the prior art is also not likely to occur in the level shifter 400 of the claimed invention. Accordingly, the circuit operation process described above forms a robust self-consistent action capable of achieving a high-speed performance without any power leakage problem.

When a low voltage is applied to the external input signal VIN 433, the low voltage is then furnished to the input of the inverter 431, the gate of the fifth transistor 424, and the gate of the fourth transistor 422. The fifth transistor 424 is then turned off due to the low voltage applied to its gate terminal. The internal input signal VX 434 at the third contact point 432 is switching to a ground voltage by the inverter 431. The second transistor 412 is turned off due to the ground voltage furnished to its gate terminal connected to the third contact point 432.

Consequently, the external output signal VOUT 414 connected to the drain of the second transistor 412 cannot be pulled down to the ground voltage. However, the gate-source voltage drop of the fourth transistor 422 is now approximately equal to the low voltage because of the low voltage at its gate terminal and the ground voltage at its source terminal, which means at the third contact point 432, and the fourth transistor 422 is then turned on. The ground voltage at the third contact point 432 is thus coupled to the gate of the first transistor 411 through the fourth transistor 422 and turns on the first transistor 411.

Accordingly, the first contact point 413 is electrically connected to the high supply voltage VCCH through the first transistor 411 and the external output signal VOUT 414 can be pulled up to the high voltage. The high voltage at the first contact point 413 is then coupled to the gate of the third transistor 421 and turns off the third transistor 421. Again, the circuit operation process described above forms a robust self-consistent action.

In summary, the voltage level shifter 400 is a robust circuit design having a high-speed and low-leakage performance.

Figure 5:
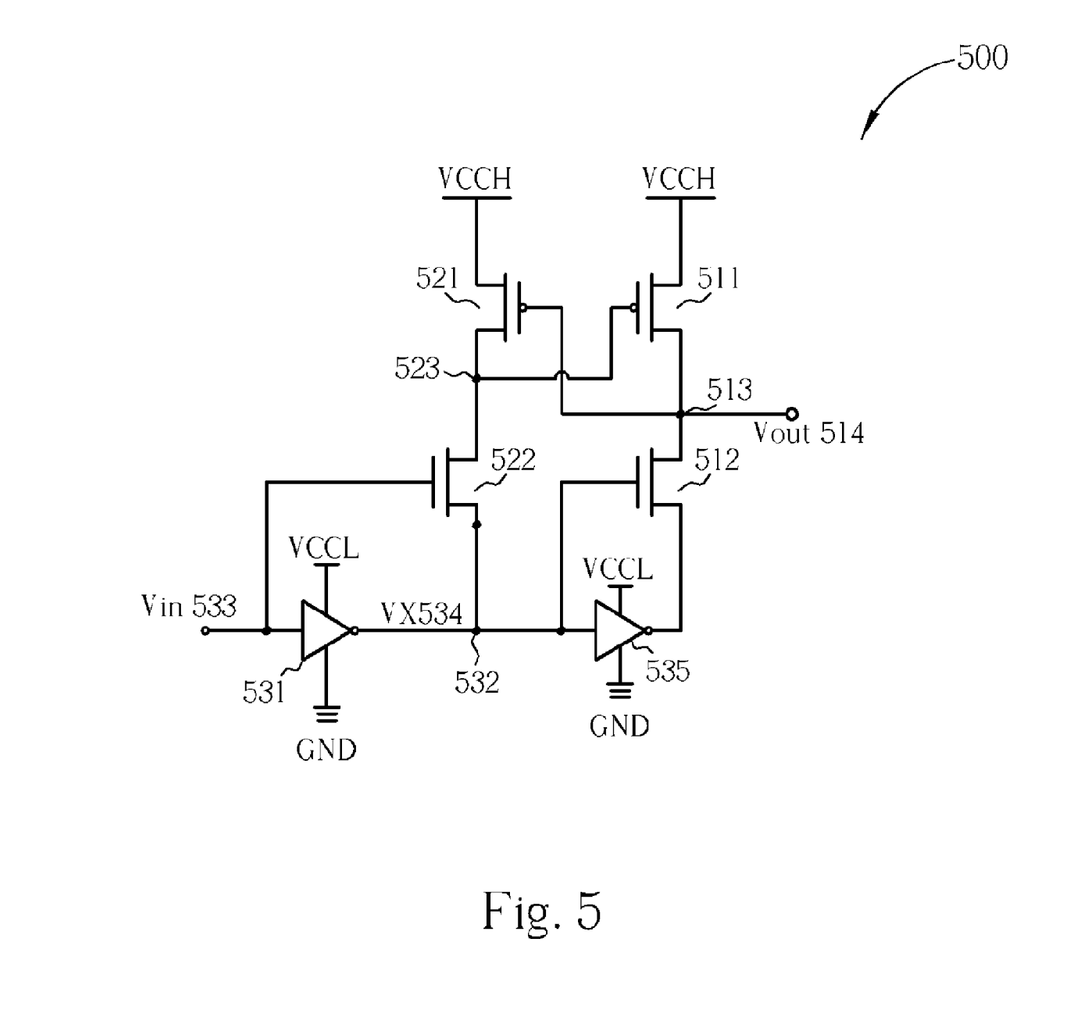
FIG. 5 is a circuit diagram schematically illustrating a third preferred embodiment of the voltage level shifter according to the claimed invention.

Please refer to FIG. 5. FIG. 5 is a circuit diagram schematically illustrating a third preferred embodiment of a voltage level shifter 500 according to the claimed invention. The voltage level shifter 500 of the present invention comprises a first transistor 511, a second transistor 512, a third transistor 521, a fourth transistor 522 having a low threshold voltage, a first inverter 531, and a second inverter 535. In addition, there is a reference voltage generator, not shown in the figure, for providing a high supply voltage VCCH and a low supply voltage VCCL.

The structure of the voltage level shifter 500 is the same as that shown in FIG. 3, differing only in that a second inverter 535 is added and coupled between the gate and source of the second transistor 512.

The first inverter 531 functions to invert the external input signal VIN 533 to generate an internal input signal VX 534 at the third contact point 532. That is, the internal input signal VX 534 is at a low voltage while the external input signal VIN 533 is at a ground voltage and the internal input signal VX 534 is at a ground voltage while the external input signal VIN 533 is at a low voltage.

The second inverter 535 is utilized to invert the internal input signal VX 534 at the third contact point 532 to generate the output of the second inverter 535 electrically connected to the source of the second transistor 512. That is, the source of the second transistor 512 is at a low voltage while the internal input signal VX 534 is at a ground voltage and the source of the second transistor 512 is at a ground voltage while the internal input signal VX 534 is at a low voltage.

With the aid of the second inverter 535, the second transistor 512 in conjunction with the first transistor 511 acts to perform an inverting process having different voltage swings between inputting and outputting. That is, the external output signal VOUT 514 is at a high voltage while the internal input signal VX 534 is at a ground voltage and the external output signal VOUT 514 is at a ground voltage while the internal input signal VX 534 is at a low voltage.

When a ground voltage is applied to the external input signal VIN 533, the ground voltage is then furnished to both the input of the inverter 531 and the gate of the fourth transistor 522. The internal input signal VX 534 at the third contact point 532 is switching to a low voltage by the inverter 531. The low voltage of the internal input signal VX 534 is then furnished to the gate of the second transistor 512. Thereafter, the source of the second transistor 512 is switching to a ground voltage by the second inverter 535. The gate voltage of the second transistor 512 having a low voltage minus the source voltage of the second transistor 512 having a ground voltage leaves the gate-source voltage drop of the second transistor 512, which is approximately equal to the low voltage and will turn on the second transistor 512.

Consequently, the external output signal VOUT 514 connected to the drain of the second transistor 512 is grounded through the second transistor 512 and is pulled down to the ground voltage of the source voltage of the second transistor 512. The external output signal VOUT 514 having the ground voltage is then coupled into the gate of the third transistor 521 and turns on the third transistor 521. The voltage at the second contact point 523 is now pulled up to the high voltage by the high supply voltage VCCH through the third transistor 521. The high voltage at the second contact point 523 is then coupled into the gate of the first transistor 511 and turns off the first transistor 511. That is, the external output signal VOUT 514 cannot be pulled up to the high voltage through the first transistor 511. The gate voltage of the fourth transistor 522 having a ground voltage minus the source voltage of the fourth transistor 522 having a low voltage leaves the gate-source voltage drop of the fourth transistor 522, which is now a minus voltage and will definitely turn off the fourth transistor 522 having a low threshold voltage.

Accordingly, the power leakage pathway in the high-speed level shifter 200 of the prior art is not likely to occur in the level shifter 500 of the claimed invention. Accordingly, the circuit operation process described above forms a robust self-consistent action capable of achieving a high-speed performance without any power leakage problem.

When a low voltage is applied to the external input signal VIN 533, the low voltage is then furnished to both the input of the inverter 531 and the gate of the fourth transistor 522. The internal input signal VX 534 at the third contact point 532 is switching to a ground voltage by the inverter 531. The ground voltage of the internal input signal VX 534 is then furnished to the gate of the second transistor 512. Thereafter, the source of the second transistor 512 is switching to a low voltage by the second inverter 535. The gate voltage of the second transistor 512 having a ground voltage minus the source voltage of the second transistor 512 having a low voltage leaves the gate-source voltage drop of the second transistor 512, which is a minus voltage and will definitely turn off the second transistor 512.

Consequently, the external output signal VOUT 514 connected to the drain of the second transistor 512 cannot be pulled down to the ground voltage. However, the gate-source voltage drop of the fourth transistor 522 is now approximately equal to the low voltage because of the low voltage at its gate terminal and the ground voltage at its source terminal, which means at the third contact point 532, and the fourth transistor 522 is then turned on. The ground voltage at the third contact point 532 is thus coupled to the gate of the first transistor 511 through the fourth transistor 522 and turns on the first transistor 511.

Thereby, the first contact point 513 is electrically connected to the high supply voltage VCCH through the first transistor 511 and the external output signal VOUT 514 can be pulled up to the high voltage. The high voltage at the first contact point 513 is then coupled to the gate of the third transistor 521 and turns off the third transistor 521. Again, the circuit operation process described above forms a robust self-consistent action. The second inverter 535 comprises a seventh transistor and an eighth transistor, not shown in the figure, but may be structured similarly to the inverter 231 in FIG. 2.

In summary, the voltage level shifter 500 is a robust circuit design having a high-speed and low-leakage performance.

Figure 6:
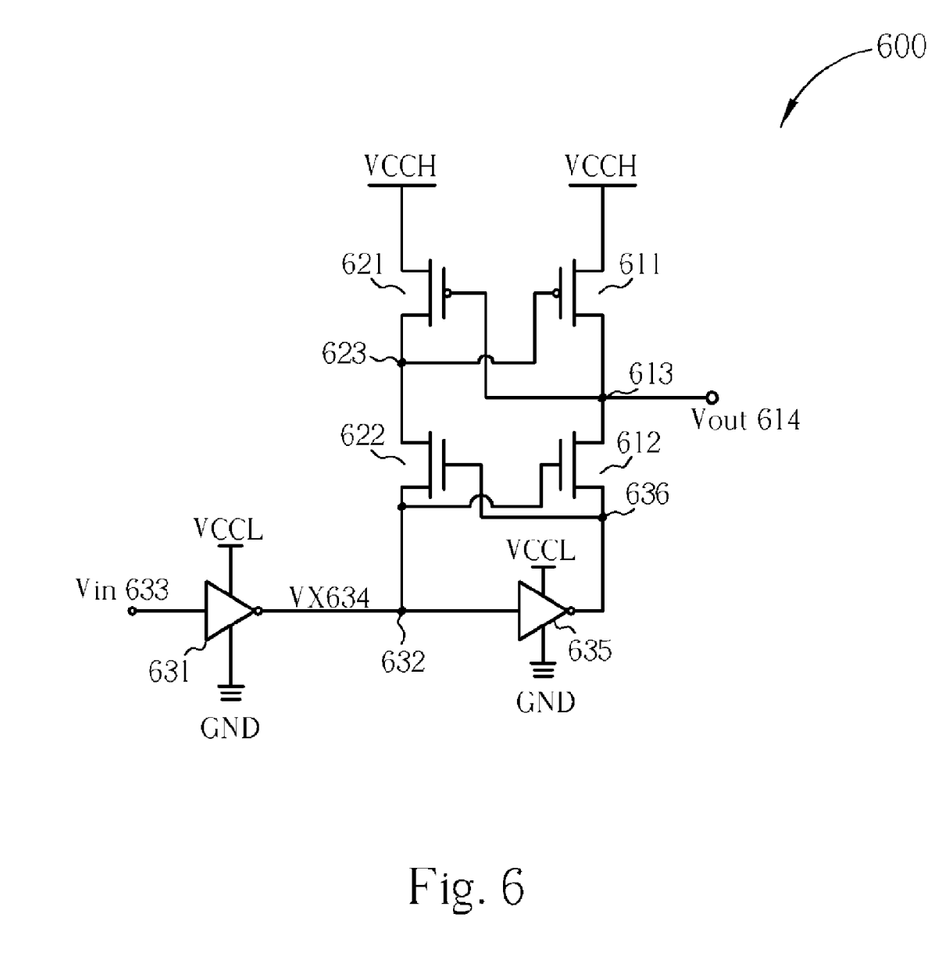
FIG. 6 is a circuit diagram schematically illustrating a fourth preferred embodiment of the voltage level shifter according to the claimed invention.

Please refer to FIG. 6. FIG. 6 is a circuit diagram schematically illustrating a fourth preferred embodiment of a voltage level shifter 600 according to the claimed invention. The voltage level shifter 600 of the present invention comprises a first transistor 611, a second transistor 612, a third transistor 621, a fourth transistor 622 having a low threshold voltage, a first inverter 631, and a second inverter 635. In addition, there is a reference voltage generator, not shown in the figure, for providing a high supply voltage VCCH and a low supply voltage VCCL.

The structure of the voltage level shifter 600 is the same as that shown in FIG. 5, differing only in that the gate of the fourth transistor 622 is coupled to the source of the second transistor 612.

The first inverter 631 functions to invert the external input signal VIN 633 to generate an internal input signal VX 634 at the third contact point 632. That is, the internal input signal VX 634 is at a low voltage while the external input signal VIN 633 is at a ground voltage and the internal input signal VX 634 is at a ground voltage while the external input signal VIN 633 is at a low voltage.

The second inverter 635 is utilized to invert the internal input signal VX 634 at the third contact point 632 to generate the output of the second inverter 635 electrically connected to the source of the second transistor 612 at the fourth contact point 636. That is, the source of the second transistor 612 is at a low voltage while the internal input signal VX 634 is at a ground voltage and the source of the second transistor 612 is at a ground voltage while the internal input signal VX 634 is at a low voltage.

With the aid of the second inverter 635, the second transistor 612 in conjunction with the first transistor 611 acts to perform an inverting process having different voltage swings between inputting and outputting. That is, the external output signal VOUT 614 is at a high voltage while the internal input signal VX 634 is at a ground voltage and the external output signal VOUT 614 is at a ground voltage while the internal input signal VX 634 is at a low voltage.

When a ground voltage is applied to the external input signal VIN 633, the ground voltage is then furnished to the input of the inverter 631. The internal input signal VX 634 at the third contact point 632 is switching to a low voltage by the inverter 631. The low voltage of the internal input signal VX 634 is then furnished to the gate of the second transistor 612.

Thereafter, the source of the second transistor 612 and the gate of the fourth transistor 622 are both switching to a ground voltage by the second inverter 635. The gate voltage of the second transistor 612 having a low voltage minus the source voltage of the second transistor 612 having a ground voltage leaves the gate-source voltage drop of the second transistor 612, which is approximately equal to the low voltage and will turn on the second transistor 612.

Consequently, the external output signal VOUT 614 connected to the drain of the second transistor 612 is grounded through the second transistor 612 and is pulled down to the ground voltage of the source voltage of the second transistor 612. The external output signal VOUT 614 having the ground voltage is then coupled into the gate of the third transistor 621 and turns on the third transistor 621. The voltage at the second contact point 623 is now pulled up to the high voltage by the high supply voltage VCCH through the third transistor 621. The high voltage at the second contact point 623 is then coupled into the gate of the first transistor 611 and turns off the first transistor 611. That is, the external output signal VOUT 614 cannot be pulled up to the high voltage through the first transistor 611. The gate voltage of the fourth transistor 622 having a ground voltage minus the source voltage of the fourth transistor 622 having a low voltage leaves the gate-source voltage drop of the fourth transistor 622, which is now a minus voltage and will definitely turn off the fourth transistor 622 having a low threshold voltage.

Accordingly, the power leakage pathway in the high-speed level shifter 200 of the prior art is not likely to occur in the level shifter 600 of the claimed invention. Accordingly, the circuit operation process described above forms a robust self-consistent action capable of achieving a high-speed performance without any power leakage problem.

When a low voltage is applied to the external input signal VIN 633, the low voltage is then furnished to the input of the inverter 631. The internal input signal VX 634 at the third contact point 632 is switching to a ground voltage by the inverter 631. The ground voltage of the internal input signal VX 634 is then furnished to the gate of the second transistor 612. Thereafter, the source of the second transistor 612 and the gate of the fourth transistor 622 are both switching to a low voltage by the second inverter 635. The gate voltage of the second transistor 612 having a ground voltage minus the source voltage of the second transistor 612 having a low voltage leaves the gate-source voltage drop of the second transistor 612, which is a minus voltage and will definitely turn off the second transistor 612.

Consequently, the external output signal VOUT 614 connected to the drain of the second transistor 612 cannot be pulled down to the ground voltage. However, the gate-source voltage drop of the fourth transistor 622 is now approximately equal to the low voltage because of the low voltage at its gate terminal and the ground voltage at its source terminal, which means at the third contact point 632, and the fourth transistor 622 is then turned on. The ground voltage at the third contact point 632 is thus coupled to the gate of the first transistor 611 through the fourth transistor 622 and turns on the first transistor 611.

Thereby, the first contact point 613 is electrically connected to the high supply voltage VCCH through the first transistor 611 and the external output signal VOUT 614 can be pulled up to the high voltage. The high voltage at the first contact point 613 is then coupled to the gate of the third transistor 621 and turns off the third transistor 621. Again, the circuit operation process described above forms a robust self-consistent action. In summary, the voltage level shifter 600 is a robust circuit design having a high-speed and low-leakage performance.

Figure 7:
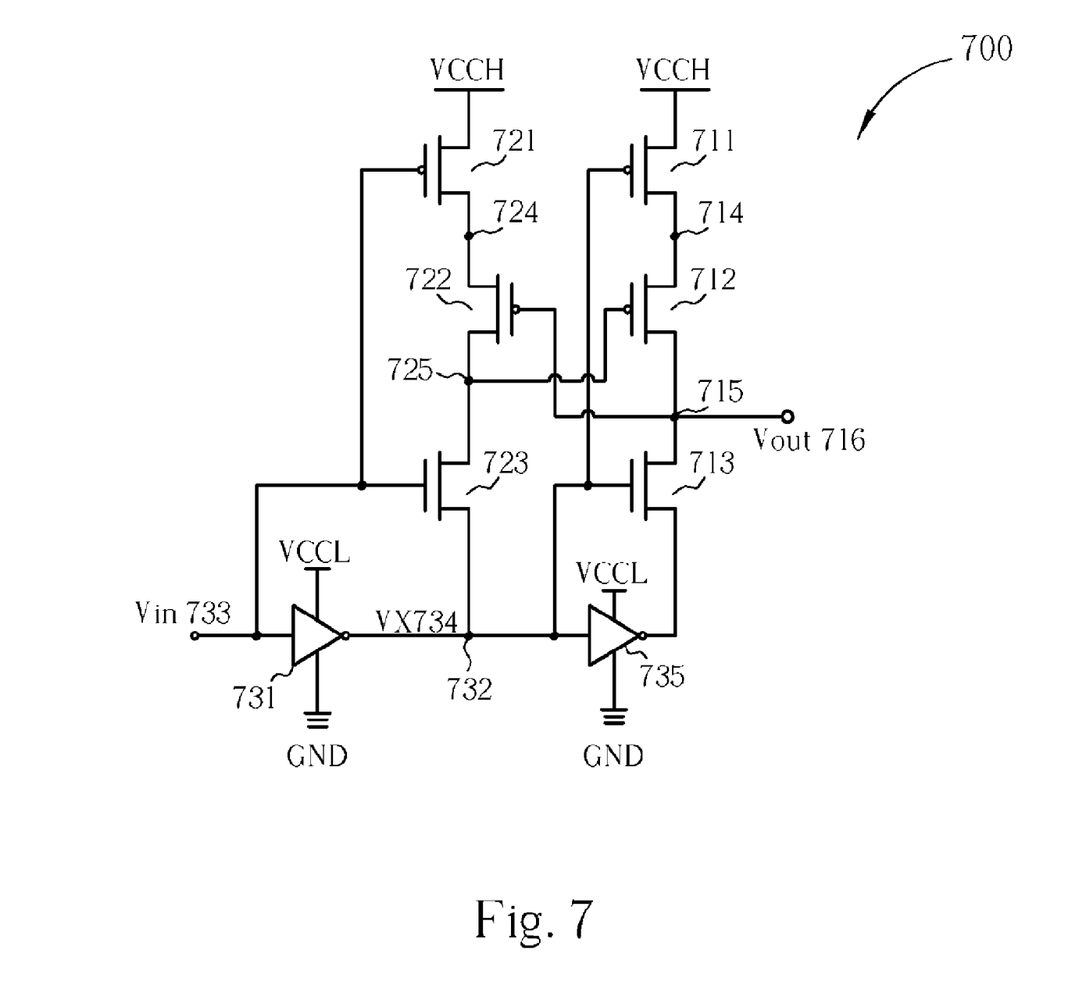
FIG. 7 is a circuit diagram schematically illustrating a fifth preferred embodiment of the voltage level shifter according to the claimed invention.

Please refer to FIG. 7. FIG. 7 is a circuit diagram schematically illustrating a fifth preferred embodiment of a voltage level shifter 700 according to the present invention. The voltage level shifter 700 of the claimed invention comprises a first transistor 711, a second transistor 712, a third transistor 713, a fourth transistor 721, a fifth transistor 722, a sixth transistor 723 having a low threshold voltage, a first inverter 731, and a second inverter 735. In addition, there is a reference voltage generator, not shown in the figure, for providing a high supply voltage VCCH and a low supply voltage VCCL.

The structure of the voltage level shifter 700 is the same as that shown in FIG. 5, differing only in that the first transistor 711 and the fourth transistor 721 are added. The first transistor 711 is coupled between the high supply voltage VCCH and the second transistor 712. The gate of the first transistor 711 is coupled to the gate of the third transistor 713. The fourth transistor 721 is coupled between the high supply voltage VCCH and the fifth transistor 722. The gate of the fourth transistor 721 is coupled to the gate of the sixth transistor 723.

The first inverter 731 functions to invert the external input signal VIN 733 to generate an internal input signal VX 734 at the fifth contact point 732. That is, the internal input signal VX 734 is at a low voltage while the external input signal VIN 733 is at a ground voltage and the internal input signal VX 734 is at a ground voltage while the external input signal VIN 733 is at a low voltage.

The second inverter 735 is utilized to invert the internal input signal VX 734 at the third contact point 732 to generate the output of the second inverter 735 electrically connected to the source of the third transistor 713. That is, the source of the third transistor 713 is at a low voltage while the internal input signal VX 734 is at a ground voltage and the source of the third transistor 713 is at a ground voltage while the internal input signal VX 734 is at a low voltage With the aid of the second inverter 735, the third transistor 713 in conjunction with the second transistor 712 and the first transistor 711 acts to perform an inverting process having different voltage swings between inputting and outputting. That is, the external output signal VOUT 716 is at a high voltage while the internal input signal VX 734 is at a ground voltage and the external output signal VOUT 716 is at a ground voltage while the internal input signal VX 734 is at a low voltage.

When a ground voltage is applied to the external input signal VIN 733, the ground voltage is then furnished to the input of the first inverter 731, the gate of the fourth transistor 721, and the gate of the sixth transistor 723. The fourth transistor 721 is then turned on due to the ground voltage applied to its gate terminal. The voltage at the third contact point 724, which means the source voltage of the fifth transistor 722, is then pulled up to high supply voltage VCCH through fourth transistor 721. The internal input signal VX 734 at the fifth contact point 732 is switching to a low voltage by the first inverter 731. The low voltage at the fifth contact point 732 is then furnished to the source of the sixth transistor 723, the gate of the first transistor 711, the gate of the third transistor 713, and the input of the second inverter 735. The first transistor 711 is thus turned off due to the low voltage furnished to its gate terminal. Thereafter, the source voltage of the third transistor 713 is switching to a ground voltage by the second inverter 735. The gate voltage of the third transistor 713 having a low voltage minus the source voltage of the third transistor 713 having a ground voltage leaves the gate-source voltage drop of the third transistor 713, which is approximately equal to the low voltage and will turn on the third transistor 713.

Consequently, the external output signal VOUT 716 connected to the drain of the third transistor 713 is grounded through the third transistor 713 and is pulled down to the ground voltage. The external output signal VOUT 716 having a ground voltage is then coupled into the gate of the fifth transistor 722. The gate voltage of the fifth transistor 722 having a ground voltage minus the source voltage of the fifth transistor 722 leaves the gate-source voltage drop of the fifth transistor 722, which is a minus voltage and will turn on the fifth voltage 722. The voltage at the fourth contact point 725 is now pulled up to the high voltage by the high supply voltage VCCH through the fourth transistor 721 and the fifth transistor 722. The high voltage at the fourth contact point 725 is then coupled into the gate of the second transistor 712 and turns off the second transistor 712. Therefore, both the first transistor 711 and the second transistor 712 are turned off under such situation. Accordingly, the external output signal VOUT 716 cannot be pulled up to the high voltage through the first transistor 711 and the second transistor 712. The gate voltage of the sixth transistor 723 having a ground voltage minus the source voltage of the sixth transistor 723 having a low voltage leaves the gate-source voltage drop of the sixth transistor 723, which is a minus voltage and will definitely turn off the sixth transistor 723 having a low threshold voltage.

Accordingly, the power leakage pathway in the high-speed level shifter 200 of the prior art is also not likely to occur in the level shifter 700 of the claimed invention. As a result, the circuit operation process described above forms a robust self-consistent action capable of achieving a high-speed performance without any power leakage problem.

When a low voltage is applied to the external input signal VIN 733, the low voltage is then furnished to the input of the inverter 731, the gate of the fourth transistor 721, and the gate of the sixth transistor 723. The fourth transistor 721 is then turned off due to the low voltage applied to its gate terminal. The internal input signal VX 734 at the fifth contact point 732 is switching to a ground voltage by the first inverter 731. The ground voltage at the fifth contact point 732 is then furnished to the source of the sixth transistor 723, the gate of the first transistor 711, the gate of the third transistor 713, and the input of the second inverter 735. The first transistor 711 is thus turned on due to the ground voltage furnished to its gate terminal. Thereafter, the source voltage of the third transistor 713 is switching to a low voltage by the second inverter 735. The gate voltage of the third transistor 713 having a ground voltage minus the source voltage of the third transistor 713 having a low voltage leaves the gate-source voltage drop of the third transistor 713, which is now a minus voltage and will definitely turn off the third transistor 713. Consequently, the external output signal VOUT 716 connected to the drain of the third transistor 713 cannot be pulled down to the low voltage.

However, the gate-source voltage drop of the sixth transistor 723 is now approximately equal to the low voltage because of the low voltage at its gate terminal and the ground voltage at its source terminal, which means at the third contact point 732, and the sixth transistor 723 is then turned on. The ground voltage at the fifth contact point 732 is thus coupled to the gate of the second transistor 712 through the sixth transistor 723 and turns on the second transistor 712. Thereby, the second contact point 715 is electrically connected to the high supply voltage VCCH through the first transistor 711 and the second transistor 712, and the external output signal VOUT 716 can be pulled up to the high voltage. The high voltage at the second contact point 715 is then coupled to the gate of the fifth transistor 722 and turns off the fifth transistor 722. Again, the circuit operation process described above forms a robust self-consistent action. In summary, the voltage level shifter 700 is a robust circuit design having a high-speed and low-leakage performance.

Figure 8:
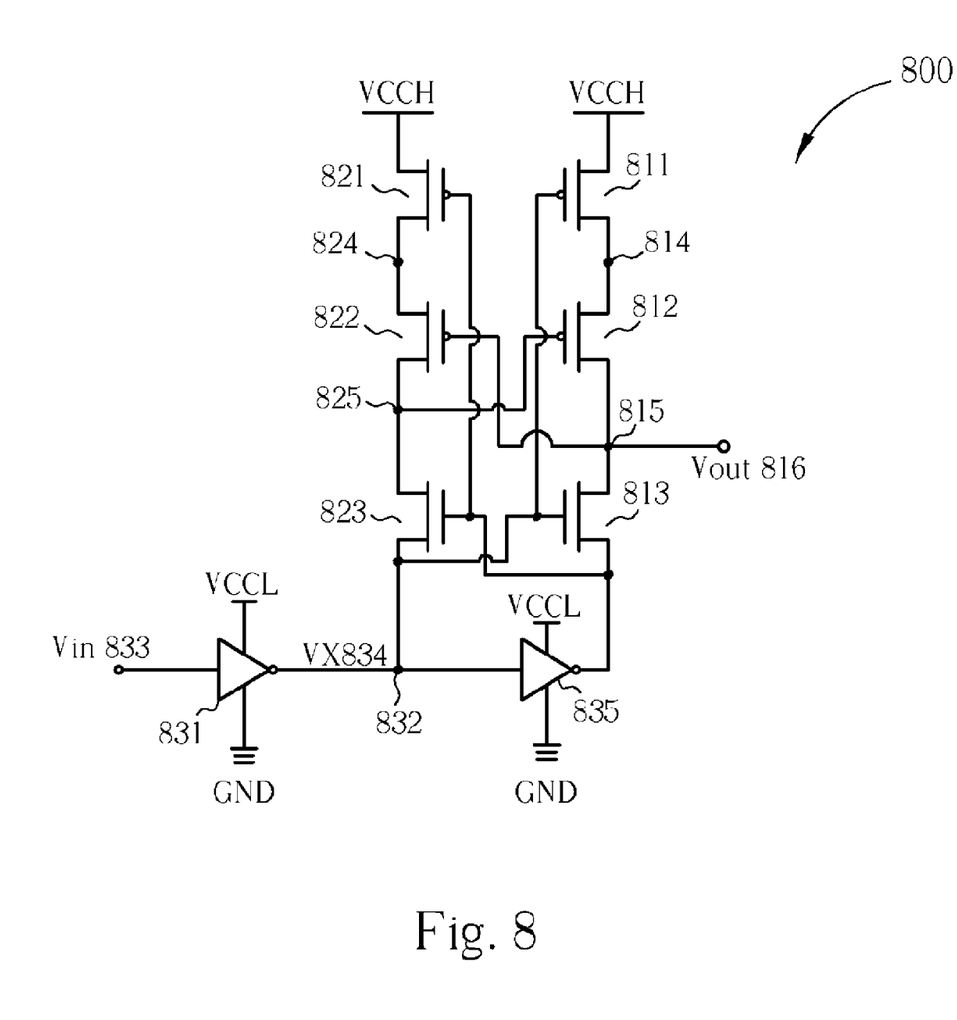
FIG. 8 is a circuit diagram schematically illustrating a sixth preferred embodiment of the voltage level shifter according to the claimed invention.

Please refer to FIG. 8. FIG. 8 is a circuit diagram schematically illustrating a sixth preferred embodiment of a voltage level shifter 800 according to the present invention. The voltage level shifter 800 of the claimed invention comprises a first transistor 811, a second transistor 812, a third transistor 813, a fourth transistor 821, a fifth transistor 822, a sixth transistor 823 having a low threshold voltage, a first inverter 831, and a second inverter 835. In addition, there is a reference voltage generator, not shown in the figure, for providing a high supply voltage VCCH and a low supply voltage VCCL.

The structure of the voltage level shifter 800 is the same as that shown in FIG. 7, differing only in that the gates of the fourth transistor 821 and the sixth transistor 823 are coupled to the source of the third transistor 813.

The first inverter 831 functions to invert the external input signal VIN 833 to generate an internal input signal VX 834 at the fifth contact point 832. That is, the internal input signal VX 834 is at a low voltage while the external input signal VIN 833 is at a ground voltage and the internal input signal VX 834 is at a ground voltage while the external input signal VIN 833 is at a low voltage.

The second inverter 835 is utilized to invert the internal input signal VX 834 at the third contact point 832 to generate the output of the second inverter 835 electrically connected to the source of the third transistor 813. That is, the source of the third transistor 813 is at a low voltage while the internal input signal VX 834 is at a ground voltage and the source of the third transistor 813 is at a ground voltage while the internal input signal VX 834 is at a low voltage With the aid of the second inverter 835, the third transistor 813 in conjunction with the second transistor 812 and the first transistor 811 acts to perform an inverting process having different voltage swings between inputting and outputting. That is, the external output signal VOUT 816 is at a high voltage while the internal input signal VX 834 is at a ground voltage and the external output signal VOUT 816 is at a ground voltage while the internal input signal VX 834 is at a low voltage.

When a ground voltage is applied to the external input signal VIN 833, the ground voltage is then furnished to the input of the first inverter 831. The internal input signal VX 834 at the fifth contact point 832 is switching to a low voltage by the first inverter 831. The low voltage at the fifth contact point 832 is then furnished to the source of the sixth transistor 823, the gate of the first transistor 811, the gate of the third transistor 813, and the input of the second inverter 835. The first transistor 811 is thus turned off due to the low voltage furnished to its gate terminal. Thereafter, the source voltage of the third transistor 813 is switching to a ground voltage by the second inverter 835. The ground voltage at the output of the second inverter 835 is also furnished to both the gate of the fourth transistor 821 and the gate of the sixth transistor 823. The fourth transistor 821 is thus turned on due to the ground voltage furnished to its gate terminal. The voltage at the third contact point 824, which means the source voltage of the fifth transistor 822, is then pulled up to high supply voltage VCCH through fourth transistor 821. The gate voltage of the third transistor 813 having a low voltage minus the source voltage of the third transistor 813 having a ground voltage leaves the gate-source voltage drop of the third transistor 813, which is approximately equal to the low voltage and will turn on the third transistor 813.

Consequently, the external output signal VOUT 816 connected to the drain of the third transistor 813 is grounded through the third transistor 813 and is pulled down to the ground voltage. The external output signal VOUT 816 having a ground voltage is then coupled into the gate of the fifth transistor 822. The gate voltage of the fifth transistor 822 having a ground voltage minus the source voltage of the fifth transistor 822 leaves the gate-source voltage drop of the fifth transistor 822, which is a minus voltage and will turn on the fifth voltage 822. The voltage at the fourth contact point 825 is now pulled up to the high voltage by the high supply voltage VCCH through the fourth transistor 821 and the fifth transistor 822. The high voltage at the fourth contact point 825 is then coupled into the gate of the second transistor 812 and turns off the second transistor 812. Therefore, both the first transistor 811 and the second transistor 812 are turned off under such situation. Accordingly, the external output signal VOUT 816 cannot be pulled up to the high voltage through the first transistor 811 and the second transistor 812. The gate voltage of the sixth transistor 823 having a ground voltage minus the source voltage of the sixth transistor 823 having a low voltage leaves the gate-source voltage drop of the sixth transistor 823, which is a minus voltage and will definitely turn off the sixth transistor 823 having a low threshold voltage.

Accordingly, the power leakage pathway in the high-speed level shifter 200 of the prior art is also not likely to occur in the level shifter 800 of the claimed invention. As a result, the circuit operation process described above forms a robust self-consistent action capable of achieving a high-speed performance without any power leakage problem.

When a low voltage is applied to the external input signal VIN 833, the low voltage is then furnished to the input of the inverter 831. The internal input signal VX 834 at the fifth contact point 832 is switching to a ground voltage by the first inverter 831. The ground voltage at the fifth contact point 832 is then furnished to the source of the sixth transistor 823, the gate of the first transistor 811, the gate of the third transistor 813, and the input of the second inverter 835. The first transistor 811 is thus turned on due to the ground voltage furnished to its gate terminal. Thereafter, the source voltage of the third transistor 813 is switching to a low voltage by the second inverter 835. The gate voltage of the third transistor 813 having a ground voltage minus the source voltage of the third transistor 813 having a low voltage leaves the gate-source voltage drop of the third transistor 813, which is now a minus voltage and will definitely turn off the third transistor 813. Consequently, the external output signal VOUT 816 connected to the drain of the third transistor 813 cannot be pulled down to the low voltage.

However, the gate-source voltage drop of the sixth transistor 823 is now approximately equal to the low voltage because of the low voltage at its gate terminal and the ground voltage at its source terminal, which means at the third contact point 832, and the sixth transistor 823 is then turned on. The ground voltage at the fifth contact point 832 is thus coupled to the gate of the second transistor 812 through the sixth transistor 823 and turns on the second transistor 812. Thereby, the second contact point 815 is electrically connected to the high supply voltage VCCH through the first transistor 811 and the second transistor 812, and the external output signal VOUT 816 can be pulled up to the high voltage. The high voltage at the second contact point 815 is then coupled to the gate of the fifth transistor 822 and turns off the fifth transistor 822. Again, the circuit operation process described above forms a robust self-consistent action. In summary, the voltage level shifter 800 is a robust circuit design having a high-speed and low-leakage performance.

As a result, based on a variety of the preferred embodiments described above, the voltage level shifter of the claimed invention provides a robust circuit design to advance the circuit performance for high-speed and low-leakage operation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage level shifter, comprising:
a reference voltage generator configured to generate a first reference voltage and a second reference voltage;
an inverting buffer stage coupled to the reference voltage generator to receive the first reference voltage, and directly connected to a fifth contact point configured to receive a first signal switching within a first voltage range and to produce an inverted second signal switching within a second voltage range at a third contact point;
a first transistor, wherein a source of the first transistor is coupled to the second reference voltage, a drain of the first transistor is electrically connected to a first contact point, and a gate of the first transistor is electrically connected to a second contact point;
a second transistor, wherein a source of the second transistor is coupled to a ground, a drain of the second transistor is electrically connected to the first contact point, and a gate of the second transistor is electrically connected to the third contact point;
a third transistor, wherein a source of the third transistor is coupled to the second reference voltage, a drain of the third transistor is electrically connected to the second contact point, and a gate of the third transistor is electrically connected to the first contact point; and
a fourth transistor, wherein a source of the fourth transistor is electrically connected to the third contact point, a drain of the fourth transistor is electrically connected to the second contact point, and a gate of the fourth transistor is directly connected to the fifth contact point;
wherein a third signal switching within a third voltage range is coupled to the first contact point.

2. The voltage level shifter of claim 1, wherein:
the second reference voltage is greater than the first reference voltage.

3. The voltage level shifter of claim 1, wherein:
the first voltage range is equal to the second voltage range.

4. The voltage level shifter of claim 3, wherein:
the first voltage range and the second voltage range comprise a first low voltage and a first high voltage;
the third voltage range comprises a second low voltage and a second high voltage; and
the second high voltage is greater than the first high voltage.

5. The voltage level shifter of claim 1, wherein:
the inverting buffer stage comprises an inverter having at least a fifth transistor and a sixth transistor, wherein a drain of the fifth transistor is coupled to a drain of the sixth transistor, a source of the fifth transistor is coupled to the first reference voltage, a source of the sixth transistor is coupled to the ground.

6. The voltage level shifter of claim 5, wherein:
the fifth transistor comprises a p-MOS field effect transistor.

7. The voltage level shifter of claim 1, further comprising:
a seventh transistor, wherein a source of the seventh transistor is coupled to the second reference voltage, a drain of the seventh transistor is coupled to the source of the third transistor, and a gate of the seventh transistor is coupled to the first signal.

8. The voltage level shifter of claim 1, wherein:
the second transistor is coupled to the ground through a second inverting buffer stage, the second inverting buffer stage is coupled to the reference voltage generator to receive the first reference voltage, and configured to receive the second signal and to produce an inverted fourth signal switching within a fourth voltage range at a fourth contact point, and the second inverting buffer is coupled to the ground and the first reference voltage to receive a supply voltage.

9. The voltage level shifter of claim 8 further comprising:
a fifth transistor, wherein a source of the fifth transistor is coupled to the second reference voltage, a drain of the fifth transistor is electrically connected the source of the first transistor, and a gate of the fifth transistor is electrically connected to the second contact point; and
a sixth transistor, wherein a source of the sixth transistor is coupled to the second reference voltage, a drain of the sixth transistor is electrically connected to the source of the third transistor and a gate of the sixth transistor is coupled to the first signal.

10. A voltage level shifter, comprising:
a reference voltage generator configured to generate a first reference voltage and a second reference voltage;
an inverting buffer stage coupled to the reference voltage generator to receive the first reference voltage, and coupled to a fifth contact point configured to receive a first signal switching within a first voltage range and to produce an inverted second signal switching within a second voltage range at a third contact point;
a first transistor, wherein a source of the first transistor is coupled to the second reference voltage, a drain of the first transistor is electrically connected to a first contact point, and a gate of the first transistor is electrically connected to a second contact point;
a second transistor, wherein a source of the second transistor is coupled to a ground, a drain of the second transistor is electrically connected to the first contact point, and a gate of the second transistor is electrically connected to the third contact point;
a third transistor, wherein a source of the third transistor is coupled to the second reference voltage, a drain of the third transistor is electrically connected to the second contact point, and a gate of the third transistor is electrically connected to the first contact point; and
a fourth transistor, wherein a source of the fourth transistor is electrically connected to the third contact point, a drain of the fourth transistor is electrically connected to the second contact point, and a gate of the fourth transistor is coupled to the fifth contact point,
wherein a third signal switching within a third voltage range is coupled to the first contact point and the inverting buffer stage and the gate of the fourth transistor receive the first signal simultaneously.

11. The voltage level shifter of claim 10, wherein:
the second reference voltage is greater than the first reference voltage.

12. The voltage level shifter of claim 10, wherein:
the first voltage range is equal to the second voltage range.

13. The voltage level shifter of claim 12, wherein:
the first voltage range and the second voltage range comprise a first low voltage and a first high voltage; the third voltage range comprises a second low voltage and a second high voltage; and the second high voltage is greater than the first high voltage.

14. The voltage level shifter of claim 10, wherein:
the inverting buffer stage comprises an inverter having at least a fifth transistor and a sixth transistor, wherein a drain of the fifth transistor is coupled to a drain of the sixth transistor, a source of the fifth transistor is coupled to the first reference voltage, a source of the sixth transistor is coupled to the ground.

15. The voltage level shifter of claim 14, wherein:
the fifth transistor comprises a p-MOS field effect transistor.

16. The voltage level shifter of claim 10, further comprising:
a seventh transistor, wherein a source of the seventh transistor is coupled to the second reference voltage, a drain of the seventh transistor is coupled to the source of the third transistor, and a gate of the seventh transistor is coupled to the first signal.

17. The voltage level shifter of claim 10, wherein:
the second transistor is coupled to the ground through a second inverting buffer stage, the second inverting buffer stage is coupled to the reference voltage generator to receive the first reference voltage, and configured to receive the second signal and to produce an inverted fourth signal switching within a fourth voltage range at a fourth contact point, and the second inverting buffer is coupled to the ground and the first reference voltage to receive a supply voltage.

18. The voltage level shifter of claim 17 further comprising:
a fifth transistor, wherein a source of the fifth transistor is coupled to the second reference voltage, a drain of the fifth transistor is electrically connected to the source of the first transistor, and a gate of the fifth transistor is electrically connected to the second contact point; and
a sixth transistor, wherein a source of the sixth transistor is coupled to the second reference voltage, a drain of the sixth transistor is electrically connected to the source of the third transistor, and a gate of the sixth transistor is coupled to the first signal.

* * * * *